United States Patent
Sasaki et al.

(10) Patent No.: US 11,177,800 B2
(45) Date of Patent: Nov. 16, 2021

(54) POWER TRANSMISSION DEVICE AND CONTACTLESS POWER TRANSMISSION DEVICE

(71) Applicant: SHARP KABUSHIKI KAISHA, Sakai (JP)

(72) Inventors: Masato Sasaki, Sakai (JP); Keiichi Sakuno, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/954,518

(22) PCT Filed: Dec. 3, 2018

(86) PCT No.: PCT/JP2018/044394
§ 371 (c)(1),
(2) Date: Jun. 17, 2020

(87) PCT Pub. No.: WO2019/124034
PCT Pub. Date: Jun. 27, 2019

(65) Prior Publication Data
US 2021/0091765 A1    Mar. 25, 2021

(30) Foreign Application Priority Data

Dec. 22, 2017   (JP) ............... JP2017-245832

(51) Int. Cl.
*H03K 17/16* (2006.01)
*H02M 7/537* (2006.01)
*H02J 50/12* (2016.01)
*H03K 17/60* (2006.01)
*H03K 17/687* (2006.01)

(52) U.S. Cl.
CPC .............. *H03K 17/16* (2013.01); *H02J 50/12* (2016.02); *H02M 7/537* (2013.01); *H03K 17/60* (2013.01); *H03K 17/687* (2013.01)

(58) Field of Classification Search
CPC ....... H03K 17/16; H03K 17/60; H03K 17/687
See application file for complete search history.

(56) References Cited

U.S. PATENT DOCUMENTS

2013/0049654 A1*   2/2013   Kure .................. B60L 50/51
                                                     318/400.2

FOREIGN PATENT DOCUMENTS

JP    2015-206734 A    11/2015

* cited by examiner

*Primary Examiner* — Sibin Chen
(74) *Attorney, Agent, or Firm* — ScienBiziP, P.C.

(57) ABSTRACT

A power transmission device is provided that enables more accurate detection of an undesired switching state for a switching element and an appropriate supply of power. The power transmission device includes a power supply, a switching element, a ringing detection circuit, and a control circuit unit. The ringing detection circuit detects ringing that occurs in the switching element. The control circuit unit controls at least the power supply or the switching element in accordance with a detection result of the ringing detection circuit. The ringing detection circuit includes a diode and a resistor. The diode conducts when a negative polarity voltage is generated in the switching element. The resistor is connected in series with the diode.

19 Claims, 6 Drawing Sheets

(a)

(b)

(a)

(b)

(a)

(b)

POWER TRANSMISSION DEVICE AND CONTACTLESS POWER TRANSMISSION DEVICE

TECHNICAL FIELD

The present disclosure relates to a technique for supplying power to electrical equipment.

The present application claims priority from Japanese Patent Application No. 2017-245832 filed in Japan on Dec. 22, 2017, the content of which is incorporated herein.

BACKGROUND ART

There has been a technique regarding a wireless power transmission system for wirelessly (contactlessly) supplying power to electrical equipment. In this wireless power transmission system, to achieve a reduction in the size of a device, the frequency of a voltage waveform is made higher. To reduce an increase in possible loss in making the frequency higher, a class E inverter circuit is used.

In the class E inverter circuit, appropriate circuit component values are determined so that a voltage waveform and a current waveform of a switching element do not overlap in terms of time, thereby enabling a reduction in switching loss. In the class E inverter circuit, however, when the switching element continues to be in a hard switching state, the switching element deviates from desired switching operation, resulting in an increase in switching loss.

CITATION LIST

Patent Literature

PTL 1: Japanese Unexamined Patent Application Publication No. 2015-206734

SUMMARY OF INVENTION

Technical Problem

Thus, in the class E inverter circuit, a technique is desired that enables detection of an undesired switching state.

For example, PTL 1 discloses a temperature calculation device for a semiconductor element, and the temperature calculation device includes a first calculation means that calculates a ringing amplitude contained in a waveform of a current or voltage at a time when the semiconductor element is switched between an on state and an off state, and a second calculation means that calculates a temperature of the semiconductor element in accordance with the ringing amplitude. Specifically, in a switching circuit 1, when a switching element Q1 is turned off, the amplitude of ringing that occurs in a drain-source voltage waveform of the switching element Q1 is calculated, and an increase in the temperature of a feedback diode D1 is estimated. For this reason, the temperature of a semiconductor element, such as the feedback diode D1, can be estimated with no temperature detection element being disposed.

Thus, the temperature detection device disclosed in PTL 1 has a circuit configuration for detecting ringing at a time when a drain voltage is in a high voltage state when the switching element is turned off. For this reason, in this circuit configuration, when the switching element is turned on, the occurrence of ringing in a drain-source voltage waveform of the switching element is not able to be detected. In other words, the circuit configuration disclosed in PTL 1 is not suitable for detection of an undesired switching state in a circuit using a high-frequency voltage, such as a class E inverter circuit.

The present disclosure aims to provide a power-supply device that enables more accurate detection of an undesired switching state for a switching element and an appropriate supply of power.

Solution to Problem

A power transmission device according to an aspect of the present disclosure includes a power supply; a semiconductor switching element connected to the power supply; a ringing detection circuit configured to detect ringing that occurs in the semiconductor switching element; and a control circuit configured to control at least the power supply or the semiconductor switching element in accordance with a detection result of the ringing detection circuit. The ringing detection circuit includes a diode connected in parallel with the semiconductor switching element and configured to conduct when a negative polarity voltage is generated in the semiconductor switching element, and a resistor connected in parallel with the semiconductor switching element and connected in series with the diode.

Advantageous Effects of Invention

As described above, the power transmission device according to the aspect of the present disclosure enables more accurate detection of an undesired switching state for the switching element, such as a hard switching state, and an appropriate supply of power.

DESCRIPTION OF EMBODIMENTS

Figure 1:
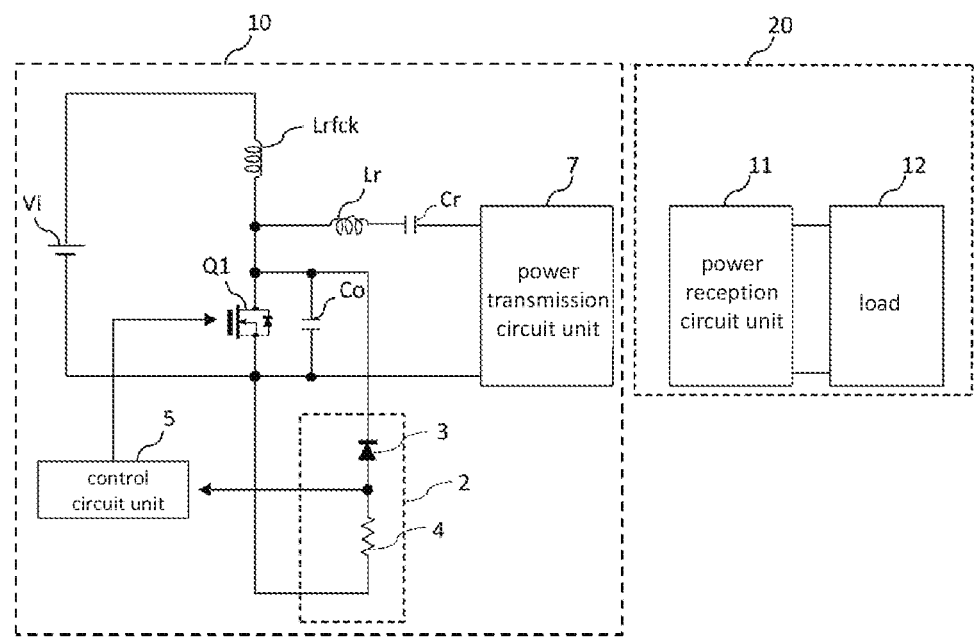
FIG. 1 is a schematic diagram illustrating an entire configuration of a wireless power transmission system according to a present embodiment.

Embodiments of the present disclosure will be described below with reference to the drawings. In the following description, the same components are designated by the same reference numerals. Their names and functions are also the same. Hence, a detailed description of these components is not repeated.

First Embodiment (Entire Configuration of Wireless Power Transmission System)

An entire configuration of a wireless power transmission system 1 according to this present embodiment will be described. FIG. 1 illustrates a circuit configuration of the wireless power transmission system 1. The wireless power transmission system 1 includes, as main constituent members, a power transmission device (power-supply device) 10 and a power reception device 20. The contactless power transmission device 10 is constituted by a ringing detection circuit 2, a control circuit unit (control circuit) 5, a power transmission circuit unit (power transmission unit) 7, and so forth that are connected to a power-supply circuit.

The ringing detection circuit 2 functions as a detection means for detecting a ringing waveform (high-frequency oscillatory waveform) that occurs in the switching element Q1. The control circuit unit 5 controls the power-supply circuit (for example, the operation, output voltage, and so forth of a switching element Q1) in accordance with a detection result of the ringing detection circuit 2. The power transmission circuit unit 7 contactlessly supplies power to a power reception circuit unit 11 of the power reception device 20. For the power-supply circuit of the contactless power transmission device 10, a configuration similar to that of a class E inverter circuit can be used. A more specific configuration of the contactless power transmission device 10 will be described later.

The power reception device 20 includes, as main constituent members, the power reception circuit unit (power reception unit) 11, a load 12, a DC/DC converter (not illustrated), and so forth. The power reception circuit unit 11 includes a resonant circuit (see FIG. 2) for contactlessly receiving power. The DC/DC converter is disposed between the power reception circuit unit 11 and the load 12 and performs voltage conversion so that an output voltage to the load 12 reaches a predetermined value.

Figure 2:
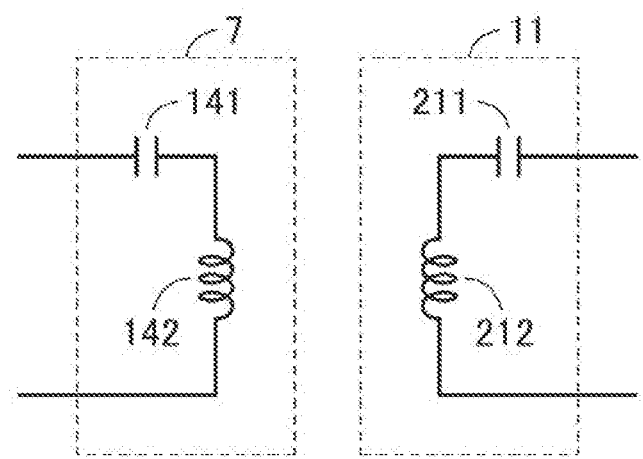
FIG. 2 is a circuit diagram illustrating a power transmission unit and a power reception unit of the wireless power transmission system according to this present embodiment.

FIG. 2 illustrates a circuit configuration of the power transmission unit (the power transmission circuit unit 7 of the contactless power transmission device 10) and the power reception unit (the power reception circuit unit 11 of the power reception device 20). As illustrated in FIG. 2, the power transmission circuit unit 7 includes a coil 142 and a capacitor 141 for power transmission to form a series resonant circuit. The power reception circuit unit 11 includes a coil 212 and a capacitor 211 for power reception to form a series resonant circuit.

Here, in the case where the wireless power transmission system 1 uses magnetic coupling (a magnetic resonance method), the coil 142 and the coil 212 are coils for generating a magnetic field, and the capacitor 141 and the capacitor 211 are capacitors for resonance.

Furthermore, in the case where the wireless power transmission system 1 uses electric field coupling, the coil 142 and the coil 212 are coils for resonance, and the capacitor 141 and the capacitor 211 are capacitors for generating an electric field.

Furthermore, the wireless power transmission system 1 using the magnetic resonance method makes a resonant frequency of a power transmission-side antenna equal to a resonant frequency of a power reception-side antenna to thereby wirelessly transmit power from the power transmission-side antenna to the power reception-side antenna. This allows a power transmission distance to range from several tens of cm to several m.

(Specific Configuration of Power Transmission Device)

Figure 3:
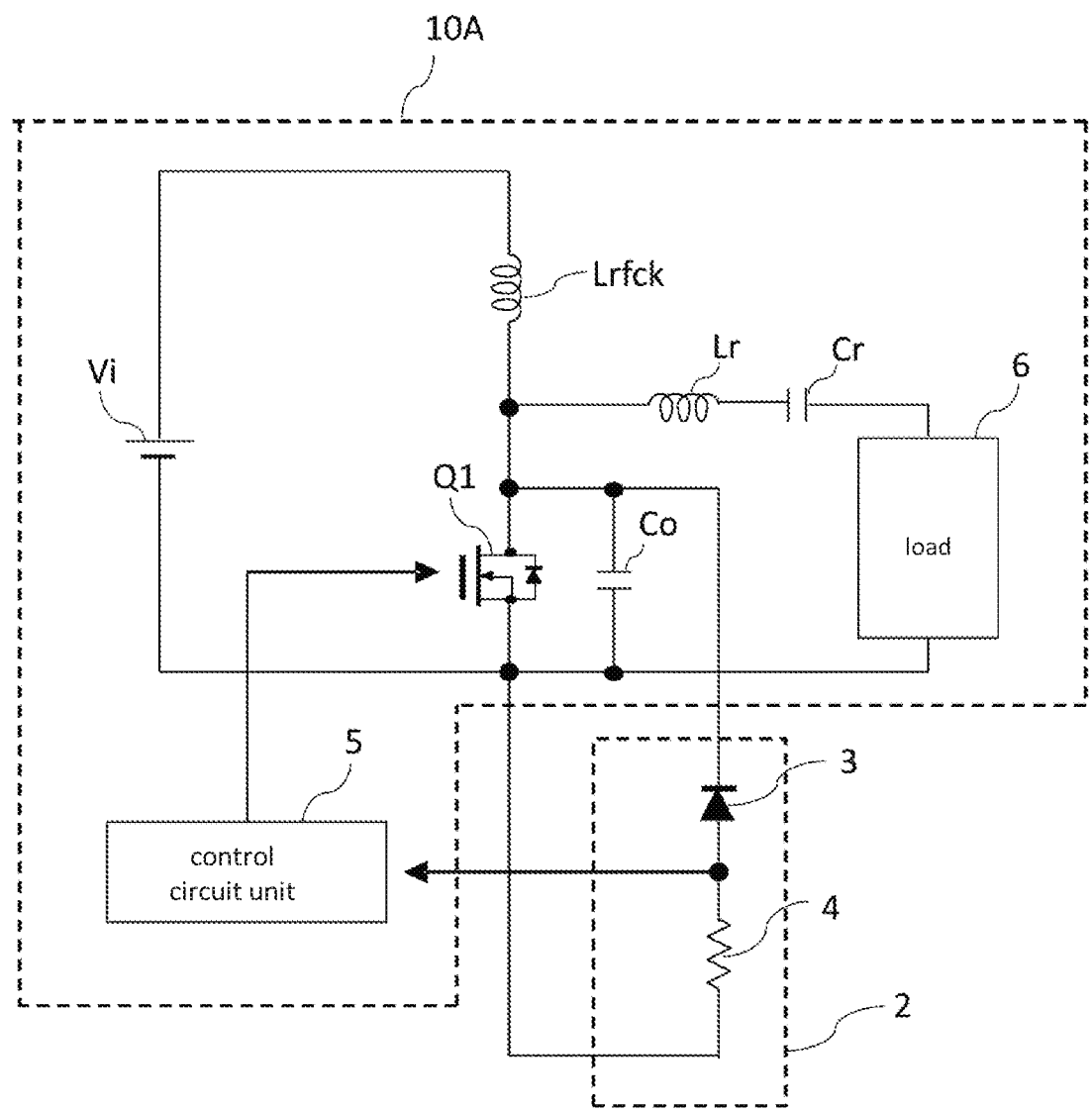
FIG. 3 is a schematic diagram illustrating a circuit configuration of a class E inverter circuit constituting a wireless power transmission device according to this present embodiment.

As described above, the contactless power transmission device 10 has a configuration similar to that of a class E inverter circuit. Before a specific configuration of the contactless power transmission device 10 is described, a circuit configuration of a basic class E inverter circuit 10A will be described. FIG. 3 illustrates the circuit configuration of the class E inverter circuit 10A.

As illustrated in FIG. 3, the class E inverter circuit 10A is constituted by a series resonant circuit including a direct-current voltage source Vi and so forth, the switching element (semiconductor switching element) Q1, a capacitor Co, a load 6, the control circuit unit 5, and so forth. The ringing detection circuit 2 for detecting a switching state of the switching element Q1 is connected to the class E inverter circuit 10A.

The series resonant circuit is constituted by the direct-current voltage source Vi, an inductor Lrfck, an inductor Lr, and a capacitor Cr that are connected in series. Thus, the series resonant circuit generates a source of current regarded as direct current.

The switching element Q1 is connected in series with the direct-current voltage source Vi and the inductor Lrfck. The switching element Q1 is a semiconductor switching element, such as a bipolar transistor or field-effect transistor (FET).

The capacitor Co is connected in parallel with the switching element Q1 and includes the parasitic capacitance of the switching element Q1.

The control circuit unit 5 drives the switching element Q1 with predetermined frequency and duty cycle. Furthermore, the control circuit is connected to the ringing detection circuit 2.

Furthermore, the ringing detection circuit 2 is constituted by a series circuit including a diode 3 and a resistor 4. The diode 3 includes an anode terminal connected to a drain terminal of the switching element Q1. A ringing waveform (high-frequency oscillatory waveform) that occurs in the switching element Q1 has a negative polarity component (see FIG. 5(*a*)). For this reason, the ringing detection circuit 2 constituted by the above-described series circuit including the diode 3 and the resistor 4 detects a negative voltage component of a ringing waveform. The ringing detection circuit 2 may include a voltmeter that measures a voltage applied to the resistor 4, an ammeter provided in series between the diode 3 and the resistor 4, and so forth. A ringing waveform detection result obtained by the ringing detection circuit 2 is transmitted to the control circuit unit 5.

Subsequently, the control circuit unit 5 changes a control specification of the class E inverter circuit 10A in accordance with the information on the negative voltage component of the ringing waveform transmitted from the ringing detection circuit 2. In changing the control specification in the control circuit unit 5, for example, a comparator, an AD converter, and so forth can be used.

Next, a method will be described in which the class E inverter circuit 10A is used for the contactless power transmission device 10 of the wireless power transmission system 1. A means to achieve a reduction in the size of a wireless power transmission system is to make the frequency of a voltage waveform higher. To reduce an increase in loss in making the frequency of a voltage waveform higher, it is desirable to use a class E inverter circuit.

In the class E inverter circuit, appropriate circuit component values are determined so that a voltage waveform and a current waveform of a switching element do not overlap in terms of time, thereby enabling a reduction in switching loss. For example, when the class E inverter circuit is placed under conditions in which a circuit component value, such as a load condition, varies, the switching element deviates from desired switching operation.

A pattern where a deviation from the desired switching operation is made includes a mode in which zero voltage is reached at a turn-on time but zero current is not reached, and a mode in which zero voltage is not reached at a turn-on time. In high-frequency operation, an increase in loss at the time of switching operation in the latter mode becomes noticeable, thereby increasing the risk of a breakdown.

Thus, a technique is desired in which safe operation is performed even under conditions in which circuit component values including a load condition vary. When the switching element deviates from desired switching operation to result in an increase in loss, the amount of heat generated therefrom increases. When an increase in the temperature of the switching element is detected, the risk of a breakdown can be avoided. However, even if a breakdown does not occur, an undesired switching state is not able to be detected.

Thus, the wireless power transmission system 1 includes the contactless power transmission device 10 to which the above-described class E inverter circuit 10A is adapted. In other words, the contactless power transmission device 10 includes the ringing detection circuit 2. This enables detection of a ringing waveform (high-frequency oscillatory waveform) that occurs in a switching waveform in the mode in which zero voltage is not reached at a turn-on time of the switching element. The control circuit unit 5 can change a control specification of the contactless power transmission device 10 to a safer control specification in accordance with a detection result (signal output result) of the ringing detection circuit 2 and enables a more appropriate supply of power to the power reception device 20.

The configuration of the contactless power transmission device 10 in the wireless power transmission system 1 according to this present embodiment is a configuration in which, in the class E inverter circuit 10A illustrated in FIG. 3, the load 6 is replaced with the power transmission circuit unit 7. The load 12 connected to the power reception circuit unit 11 in the power reception device 20 has a function similar to that of the load 6.

(Detection of Ringing in Ringing Detection Circuit)

Figure 4:
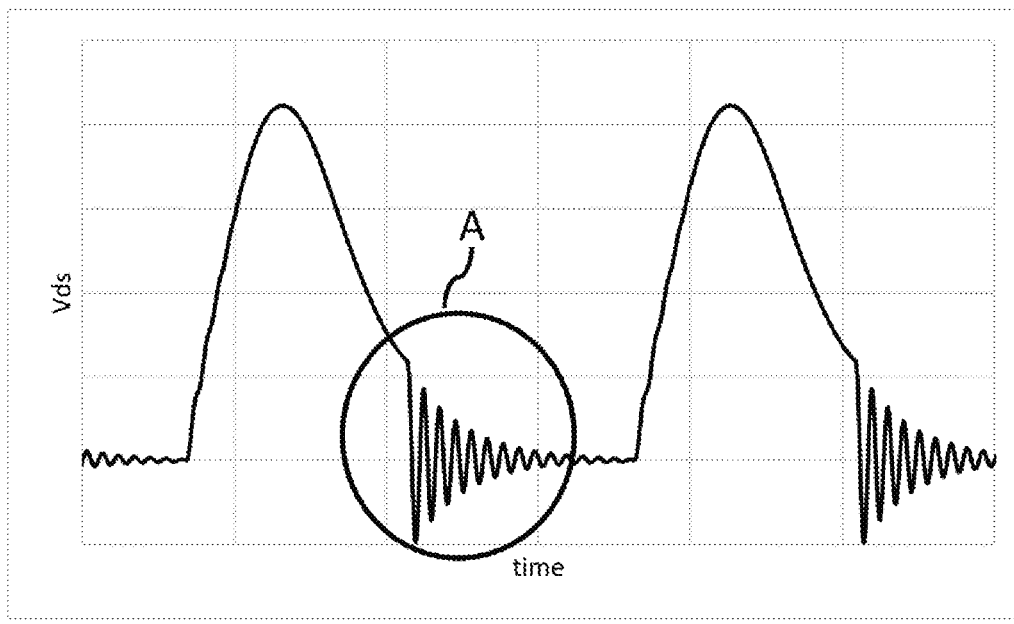
FIG. 4(a) is a waveform diagram illustrating an example of a waveform of a source-drain voltage of a switching element in a power transmission device illustrated in FIG. 1.
FIG. 4(b) is a waveform diagram illustrating an example of a waveform of a gate-source voltage of the switching element in the power transmission device illustrated in FIG. 1.
Figure 4:
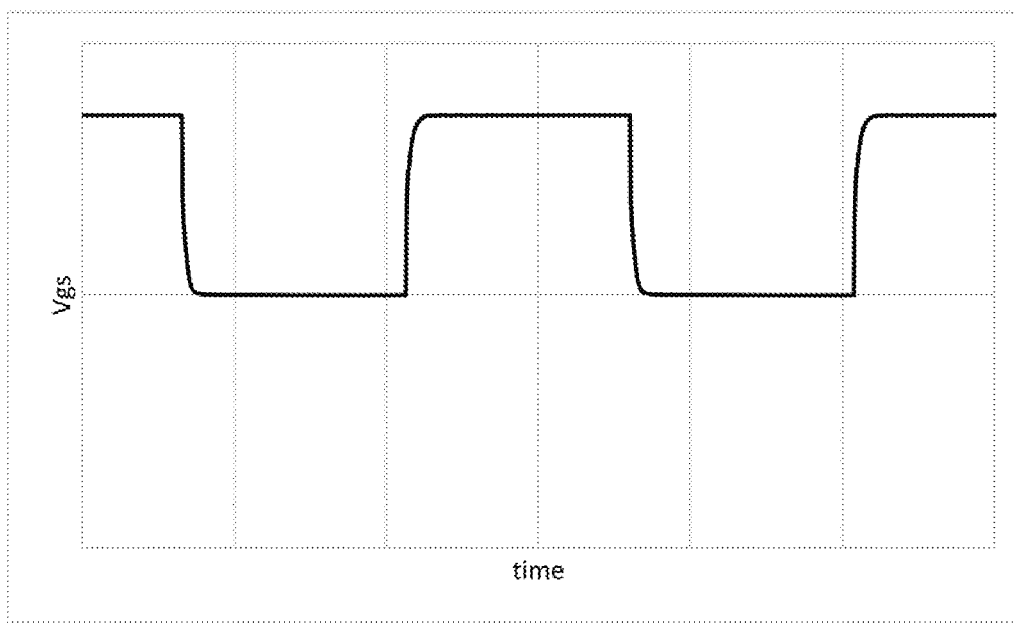
Figure 5:
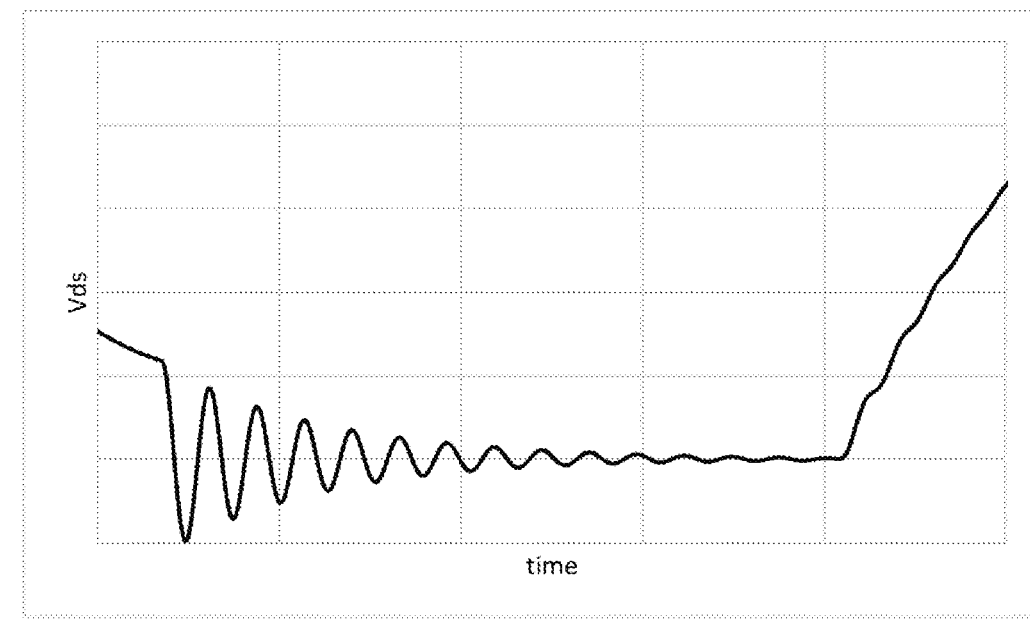
FIG. 5(a) is a waveform diagram illustrating an example of the waveform of the source-drain voltage of the switching element in the power transmission device illustrated in FIG. 1. This figure is an enlarged view of a portion corresponding to a period during which ringing is occurring in the waveform illustrated in FIG. 4(a).
FIG. 5(b) is a waveform diagram illustrating an example of a waveform of a detection voltage in a ringing detection circuit of the power transmission device illustrated in FIG. 1.
Figure 5:
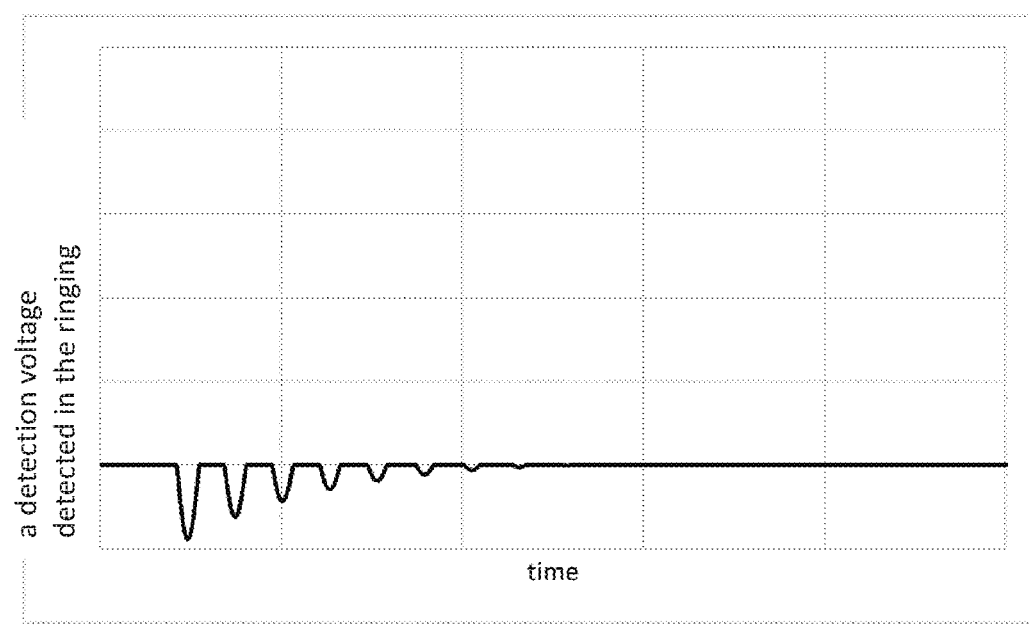

Next, a method of detecting ringing in the ringing detection circuit 2 will be described with reference to FIGS. 4 and 5.

FIG. 4(a) illustrates an example of a change over time in a drain-source voltage Vds of the switching element Q1 in the contactless power transmission device 10. In a graph illustrated in FIG. 4(a), the horizontal axis represents time, and the vertical axis represents voltage. FIG. 4(b) illustrates an example of a change over time in a gate-source voltage Vgs of the switching element Q1 in the contactless power transmission device 10. In a graph illustrated in FIG. 4(b), the horizontal axis represents time, and the vertical axis represents voltage. FIGS. 4(a) and 4(b) illustrate changes in the respective voltages in a state in which control has not been performed by the control circuit unit 5.

As illustrated in these figures, when the gate-source voltage of the switching element Q1 reaches a high level and the switching element Q1 is turned on, the drain-source voltage has not decreased to zero volts. For this reason, switching loss that leads to an increase in loss is occurring, and ringing is appearing in a waveform (see A in FIG. 4(a)).

FIG. 5(a) is a graph illustrating an enlarged view of a portion corresponding to a period during which ringing is occurring in the waveform of the drain-source voltage of the switching element Q1 illustrated in FIG. 4(a). FIG. 5(b) is a graph illustrating a waveform of a detection voltage detected in the ringing detection circuit 2 in a period corresponding to FIG. 5(a).

As illustrated in FIG. 5(b), in the ringing detection circuit 2, a voltage with a negative polarity can be detected by the diode 3 and the resistor 4 when ringing occurs in the drain-source voltage of the switching element Q1. For example, when, in a predetermined period (for example, 300 nsec., two cycles in the case of an oscillation frequency of 6.78 MHz), a voltage with a negative polarity of, for example, −2 V or less is detected two or more times, it is determined that ringing has occurred in the drain-source voltage of the switching element Q1, and the presence of ringing is transmitted as a detection result to the control circuit. In other words, when the switching element Q1 enters into a hard switching state that is undesired and ringing occurs in the switching element Q1, the ringing detection circuit 2 operates only in a period of the negative polarity.

Incidentally, when a negative voltage is not generated in the drain-source voltage of the switching element Q1, no current flows through the ringing detection circuit 2. Hence, no influence is exerted on operation of a main circuit of the contactless power transmission device 10.

(Control Method Performed in Control Circuit Unit)

Next, a method will be described in which the control circuit unit 5 controls operation of the switching element Q1 in accordance with a detection result obtained in the ringing detection circuit 2.

In the contactless power transmission device 10 according to this present embodiment, the control circuit unit 5 changes a drive duty cycle of the switching element Q1 in accordance with a detection result of the ringing detection circuit 2. Specifically, the control circuit unit 5 reduces an on-duty cycle during which the switching element Q1 is driven. In other words, an off period of the switching element Q1 is made longer than an on period.

Figure 6:
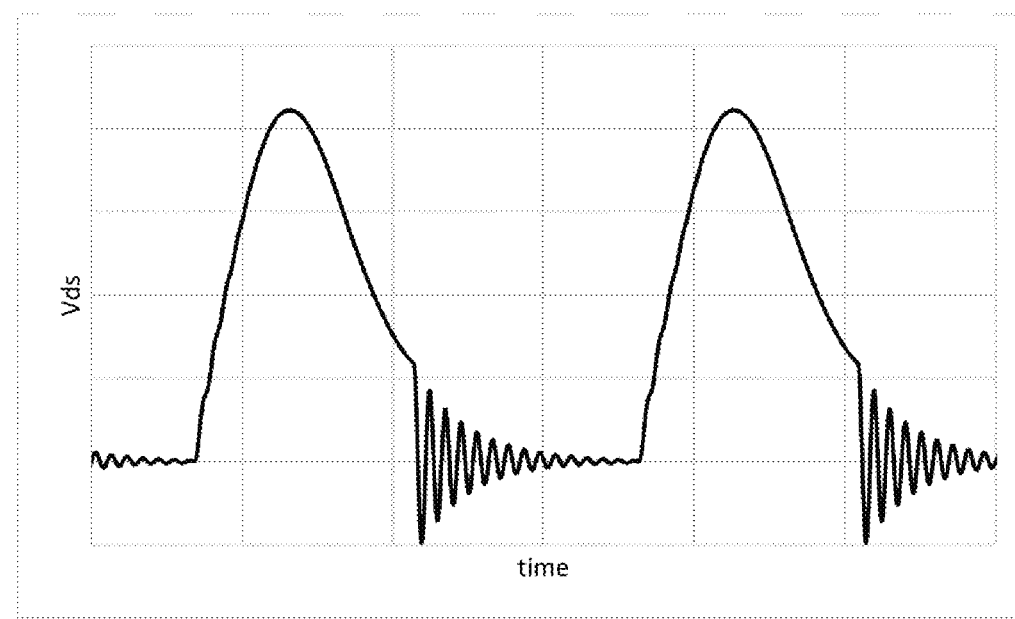
FIG. 6(a) is a waveform diagram illustrating an example of the waveform of the source-drain voltage of the switching element in the power transmission device illustrated in FIG. 1.
FIG. 6(b) is a waveform diagram illustrating an example of a waveform of the source-drain voltage after a drive duty cycle of the switching element is changed.
Figure 6:
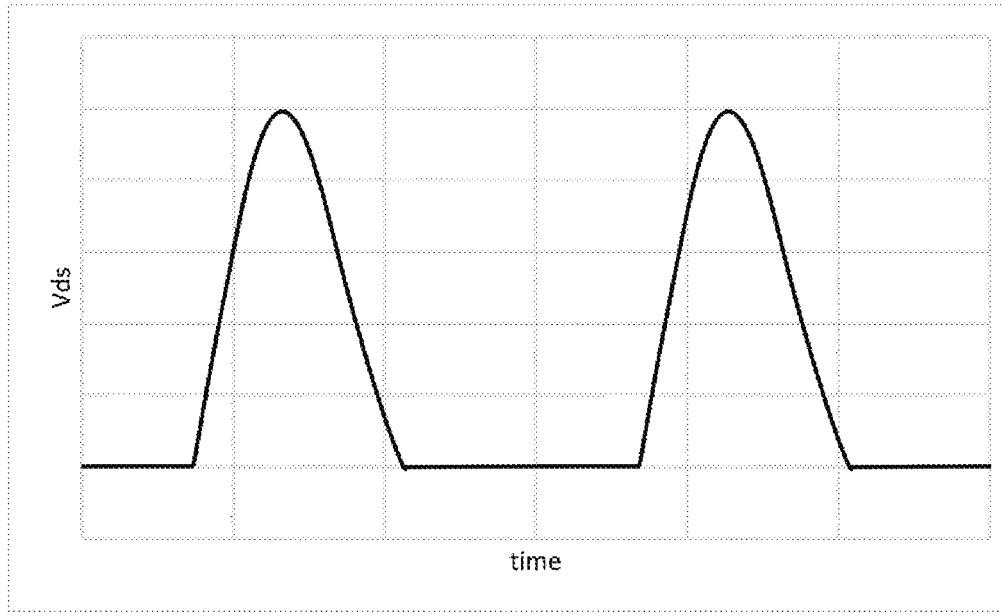

Thus, the waveform of the source-drain voltage of the switching element Q1 changes, for example, from a waveform illustrated in FIG. 6(a) to a waveform illustrated in FIG. 6(b). The waveform illustrated in FIG. 6(a) is the same as the waveform illustrated in FIG. 4(a), and a ringing waveform is seen at a turn-on time of the switching element Q1. On the other hand, when the drive duty cycle of the switching element Q1 is changed by the control circuit unit 5, an appropriate control signal is obtained as illustrated in FIG. 6(b), and ringing is cancelled.

As described above, in the contactless power transmission device 10 according to this present embodiment, there is a noticeable difference between a duty cycle of a drive signal and a duty cycle in the operation of the switching element Q1, and, if the switching element Q1 is in a hard switching state, the drive duty cycle thereof is corrected. This enables a shift to a soft switching state.

Summary of First Embodiment

As described above, the wireless power transmission system 1 according to this present embodiment includes the contactless power transmission device 10 and the power reception device 20. The contactless power transmission device 10 includes the direct-current voltage source Vi, the switching element Q1, the ringing detection circuit 2, and the control circuit unit 5. The ringing detection circuit 2 detects ringing that occurs in the switching element Q1. The control circuit unit 5 changes a drive duty cycle of the switching element Q1 in accordance with a detection result of the ringing detection circuit 2. The ringing detection circuit 2 includes the diode 3 and the resistor 4. The diode 3 and the resistor 4 are connected in parallel with the switching element Q1. The diode 3 conducts when a negative polarity voltage is generated in the switching element Q1. The resistor 4 is connected in series with the diode 3.

When the contactless power transmission device 10 operates normally, the drain-source voltage Vds of the switching element Q1 has a positive voltage waveform. Hence, a change in voltage is not detected in the ringing detection circuit 2. On the other hand, when ringing occurs at a turn-on time of the switching element Q1, a voltage with a negative polarity is generated. For this reason, a change in a waveform of a negative polarity component is detected in the ringing detection circuit 2. Thus, with respect to ringing that occurs at a turn-on time of the switching element Q1, detection of a ringing component on a negative voltage side can facilitate a determination as to whether a switching element state of the switching element Q1 is normal or abnormal. Furthermore, determination accuracy is also improved.

Hence, the wireless power transmission system 1 according to this present embodiment enables detection of an undesired state for the switching element Q1 in the contactless power transmission device 10, such as a hard switching state, and an appropriate supply of power with no load applied owing to the switching element Q1.

Incidentally, in the wireless power transmission system 1 according to this present embodiment, the control circuit unit 5 does not have to be built into the contactless power transmission device 10 and may be implemented by a circuit built into an external PC or the like. In the case where the control circuit unit 5 is not built into the contactless power transmission device 10, the control circuit unit 5 and the contactless power transmission device 10 may exchange a control signal or an output signal with each other by wire or wirelessly.

Second Embodiment

Next, a second embodiment of the present disclosure will be described. The wireless power transmission system 1 according to the second embodiment differs from that in the first embodiment in a control method for the switching element Q1 performed in the control circuit unit 5 of the contactless power transmission device 10. Except for the above, a configuration similar to that in the first embodiment is applicable.

FIG. 1 illustrates an entire configuration of the wireless power transmission system 1 according to the second embodiment. A specific configuration of the system is similar to that in the first embodiment, and a detailed description thereof is therefore omitted.

Next, in the wireless power transmission system 1 according to this present embodiment, a method will be described in which the control circuit unit 5 controls operation of the switching element Q1 in accordance with a detection result obtained in the ringing detection circuit 2.

In the contactless power transmission device 10 constituting the wireless power transmission system 1, the control circuit unit 5 causes switching operation of the switching element Q1 to stop in accordance with a detection result of the ringing detection circuit 2. Specifically, when a waveform, such as the waveform illustrated in FIG. 5(b), is detected in the ringing detection circuit 2, an output signal thereof is transmitted to the control circuit unit 5. At this time, the control circuit unit 5 determines that ringing has occurred in the switching element Q1 and causes operation of the switching element Q1 to stop.

As described above, in the contactless power transmission device 10 of the wireless power transmission system 1 according to this present embodiment, when the occurrence of ringing in the switching element Q1 is recognized, switching operation of the switching element Q1 stops. Thus, when an undesired switching state for the switching element Q1 is detected, operation of the switching element Q1 is caused to stop to stop supplying power, thereby enabling a safer supply of power.

Third Embodiment

Next, a third embodiment of the present disclosure will be described. The wireless power transmission system 1 according to the third embodiment differs from that in the first embodiment in a control method for the contactless power transmission device 10 performed in the control circuit unit 5. Except for the above, a configuration similar to that in the first embodiment is applicable.

FIG. 1 illustrates an entire configuration of the wireless power transmission system 1 according to the third embodiment. A specific configuration of the system is similar to that in the first embodiment, and a detailed description thereof is therefore omitted.

Next, in the wireless power transmission system 1 according to this present embodiment, a method will be described in which the control circuit unit 5 controls a power supply voltage of the contactless power transmission device 10 in accordance with a detection result obtained in the ringing detection circuit 2.

In the contactless power transmission device 10 constituting the wireless power transmission system 1, the control circuit unit 5 causes a power supply voltage of the contactless power transmission device 10 to decrease in accordance with a detection result of the ringing detection circuit 2. Specifically, when a waveform, such as the waveform illustrated in FIG. 5(b), is detected in the ringing detection circuit 2, an output signal thereof is transmitted to the control circuit unit 5. At this time, the control circuit unit 5 determines that ringing has occurred in the switching element Q1 and causes a voltage value of the direct-current voltage source Vi to decrease. Specifically, the direct-current voltage source Vi is implemented, for example, as an output voltage of a DC/DC converter (not illustrated), and the control circuit 5 causes a constant voltage control value of the DC/DC converter to decrease.

As described above, in the contactless power transmission device 10 of the wireless power transmission system 1 according to this present embodiment, when the occurrence of ringing in the switching element Q1 is recognized, the power supply voltage of the contactless power transmission device 10 is caused to decrease. When power applied to the contactless power transmission device 10 is caused to decrease, loss energy of the switching element Q1 can be reduced. Thus, when an undesired switching state for the switching element Q1 is detected, switching loss can be reduced. This can reduce the possibility of breakage of the switching element Q1.

Fourth Embodiment

Next, a fourth embodiment of the present disclosure will be described. In the above-described first to third embodiments, when the occurrence of ringing is detected, the control circuit unit 5 controls the switching element Q1 or the power supply of the contactless power transmission device 10 by using the respective different methods.

In an aspect of the present disclosure, however, the control circuit unit 5 may control the switching element Q1 and the power supply with a combination of the control methods described in the first to third embodiments. Thus, the contactless power transmission device 10 can be provided that enables detection of an undesired switching state for the switching element Q1 and a more appropriate supply of power. For example, a combination of the second embodiment and the third embodiment reduces the power consumption of and load on a device other than the switching element Q1, and the risk of a breakdown can be avoided.

Fifth Embodiment

Next, a fifth embodiment of the present disclosure will be described. In the above-described first to fourth embodiments, the contactless power transmission device 100 used in the wireless power transmission system 1 has been described.

Figure 7:
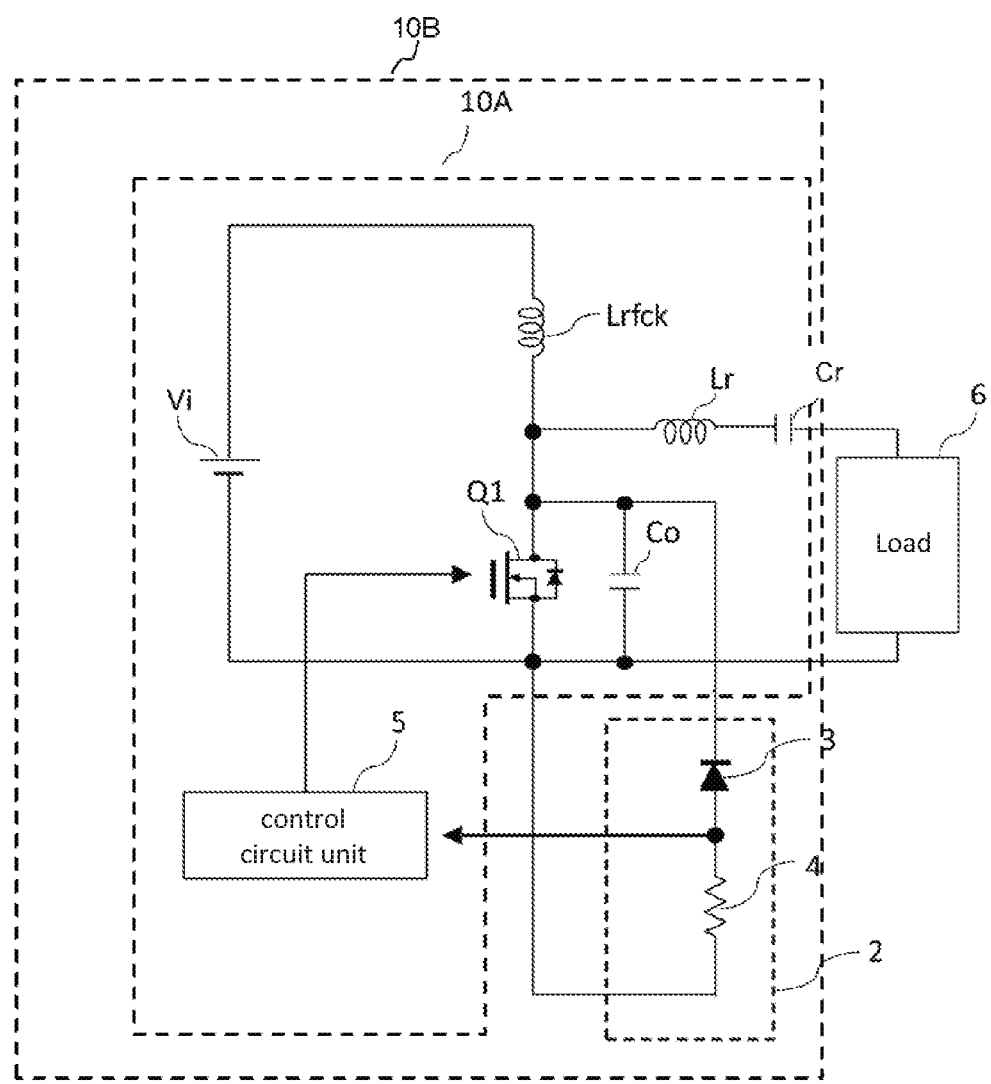
FIG. 7 is a schematic diagram illustrating an entire configuration including a power transmission device according to a present embodiment and a load to which power is supplied by the power transmission device.

In an aspect of the present disclosure, however, a power transmission device 10B may be connected to the load 6 not wirelessly but by wire as illustrated in FIG. 7. The load 6 may be electronic equipment, such as a smartphone.

[Summary]

A power transmission device (for example, contactless power transmission device 10) according to an aspect of the present disclosure includes a power supply (for example, direct-current voltage source Vi); a semiconductor switching element (for example, switching element Q1) connected to the power supply; a ringing detection circuit (for example, ringing detection circuit 2) configured to detect ringing that occurs in the semiconductor switching element; and a control circuit (for example, control circuit unit 5) configured to control at least the power supply or the semiconductor switching element in accordance with a detection result of the ringing detection circuit. The ringing detection circuit includes a diode (for example, diode 3) connected in parallel with the semiconductor switching element and configured to conduct when a negative polarity voltage is generated in the semiconductor switching element, and a resistor (for example, resistor 4) connected in parallel with the semiconductor switching element and connected in series with the diode.

Furthermore, in the power transmission device according to the above-described aspect of the present disclosure, the control circuit may change a drive duty cycle of the semiconductor switching element in accordance with a detection result of the ringing detection circuit.

Furthermore, in the power transmission device according to the above-described aspect of the present disclosure, the control circuit may cause switching operation of the semiconductor switching element to stop in accordance with a detection result of the ringing detection circuit.

Furthermore, in the power transmission device according to the above-described aspect of the present disclosure, the control circuit may cause a power supply voltage of the power supply to decrease in accordance with a detection result of the ringing detection circuit.

The embodiments disclosed here are to be considered to be illustrative and not limiting in any respect. The scope of the present invention is defined not by the above descriptions, but by the claims, and is intended to include all changes made within the meaning and scope equivalent to the claims. Furthermore, a configuration obtained by combining configurations in respective different embodiments described in the present description with each other is also within the scope of the present invention.

The invention claimed is:

1. A power transmission device comprising:
a power supply;
a semiconductor switching element connected to the power supply;
a ringing detection circuit configured to detect ringing that occurs in the semiconductor switching element; and
a control circuit configured to control at least the power supply or the semiconductor switching element in accordance with a detection result of the ringing detection circuit,
wherein the ringing detection circuit includes
a diode connected in parallel with the semiconductor switching element and configured to conduct when a negative polarity voltage is generated in the semiconductor switching element, and
a resistor connected in parallel with the semiconductor switching element and connected in series with the diode.

2. The power transmission device according to claim 1, wherein, when the ringing detection circuit detects a voltage with a negative polarity two or more times in a predetermined period, the ringing detection circuit transmits presence of occurrence of ringing as a detection result to the control circuit.

3. The power transmission device according to claim 1, wherein the control circuit changes a drive duty cycle of the semiconductor switching element in accordance with a detection result of the ringing detection circuit.

4. The power transmission device according to claim 3, wherein the control circuit changes a drive duty cycle of the semiconductor switching element in accordance with a detection result of the ringing detection circuit and makes an off period of the switching element longer than an on period.

5. The power transmission device according to claim 1, wherein the control circuit causes switching operation of the semiconductor switching element to stop in accordance with a detection result of the ringing detection circuit.

6. The power transmission device according to claim 1, wherein the control circuit causes a power supply voltage of the power supply to decrease in accordance with a detection result of the ringing detection circuit.

7. The power transmission device according to claim 1, wherein, when the ringing detection circuit detects a voltage with a negative polarity two or more times in two times term of the switching periods, the ringing detection circuit transmits presence of occurrence of ringing as a detection result to the control circuit.

8. The power transmission device according to claim 1, wherein, when the ringing detection circuit detects a peak of a negative polarity voltage equal to or less than a predetermined voltage twice or more than consecutively, the ringing detection circuit transmits presence of occurrence of ringing as a detection result to the control circuit.

9. The power transmission device according to claim 1, wherein, when the ringing detection circuit detects a peak of a negative polarity voltage equal to or less than −2V twice or more than consecutively, the ringing detection circuit transmits presence of occurrence of ringing as a detection result to the control circuit.

10. A contactless power transmission device comprising:
a power supply;
a semiconductor switching element connected to the power supply;
a coil connected to the power supply and connected in parallel with the semiconductor switching element;
a capacitor connected in series with the coil between the power supply and the coil and connected in parallel with the semiconductor switching element;
a ringing detection circuit configured to detect ringing that occurs in the semiconductor switching element; and
a control circuit configured to control at least the power supply or the semiconductor switching element in accordance with a detection result of the ringing detection circuit,
wherein the ringing detection circuit includes
a diode connected in parallel with the semiconductor switching element and configured to conduct when a negative polarity voltage is generated in the semiconductor switching element, and
a resistor connected in parallel with the semiconductor switching element and connected in series with the diode.

11. The contactless power transmission device according to claim 10, wherein, when the ringing detection circuit detects a voltage with a negative polarity two or more times in a predetermined period, the ringing detection circuit transmits presence of occurrence of ringing as a detection result to the control circuit.

12. The contactless power transmission device according to claim 10, wherein the control circuit changes a drive duty cycle of the semiconductor switching element in accordance with a detection result of the ringing detection circuit.

13. The contactless power transmission device according to claim 12, wherein the control circuit changes a drive duty cycle of the semiconductor switching element in accordance with a detection result of the ringing detection circuit and makes an off period of the switching element longer than an on period.

14. The contactless power transmission device according to claim 10, wherein the control circuit causes switching operation of the semiconductor switching element to stop in accordance with a detection result of the ringing detection circuit.

15. The contactless power transmission device according to claim 10, wherein the control circuit causes a power supply voltage of the power supply to decrease in accordance with a detection result of the ringing detection circuit.

16. The power transmission device according to claim 10, wherein, when the ringing detection circuit detects a voltage with a negative polarity two or more times in 300 nsec, the ringing detection circuit transmits presence of occurrence of ringing as a detection result to the control circuit.

17. The power transmission device according to claim 10, wherein, when the ringing detection circuit detects a peak of a negative polarity voltage equal to or less than a predetermined voltage twice or more than consecutively, the ringing detection circuit transmits presence of occurrence of ringing as a detection result to the control circuit.

18. The power transmission device according to claim 10, wherein, when the ringing detection circuit detects a peak of a negative polarity voltage equal to or less than −2V twice or more than consecutively, the ringing detection circuit transmits presence of occurrence of ringing as a detection result to the control circuit.

19. A wireless power transmission system comprising,
the contactless power transmission device according to claim 10, and
a power reception device including a resonant circuit for contactlessly receiving power that is supplied from the contactless power transmission device.

* * * * *